United States Patent [19]

Beumer et al.

[11] Patent Number: 4,642,438
[45] Date of Patent: Feb. 10, 1987

[54] WORKPIECE MOUNTING AND CLAMPING SYSTEM HAVING SUBMICRON POSITIONING REPEATABILITY

[75] Inventors: Karl W. Beumer; Charles A. Gaston; Charles H. Locke; Alfred Mack, all of Poughkeepsie; Brian C. O'Neill, Millbrook, all of N.Y.; Warren J. Pinckney, New Fairfield, Conn.; Alan D. Wilson, Armonk, N.Y.

[73] Assignee: International Business Machines Corporation, Armonk, N.Y.

[21] Appl. No.: 672,724

[22] Filed: Nov. 19, 1984

[51] Int. Cl.⁴ .............................................. B23K 26/00
[52] U.S. Cl. ......................... 219/121 L; 219/121 LY; 219/121 EX; 414/591; 414/225; 269/250
[58] Field of Search ................. 219/121 EX, 121 ED, 219/121 LX, 121 L, 121 LH, 121 EJ, 159–161; 414/591, 779, 783, 225.6; 901/45; 269/250; 560/221

[56] References Cited

U.S. PATENT DOCUMENTS

| 3,648,048 | 3/1972 | Cahan et al. | 219/121 EY |
|---|---|---|---|
| 3,874,525 | 4/1975 | Hassan et al. | 414/225 |
| 3,984,006 | 10/1976 | Takeyasu et al. | 901/45 |
| 4,439,926 | 4/1984 | Whitney et al. | 901/45 |
| 4,445,273 | 5/1984 | Van Brussel et al. | 901/45 |
| 4,532,402 | 7/1985 | Overbeck | 219/121 LY |

*Primary Examiner*—M. H. Paschall
*Attorney, Agent, or Firm*—Steven J. Meyers

[57] ABSTRACT

A high precision, high throughput submicrometer workpiece positioning system, particularly useful as a workpiece positioning means in electron beam lithography tools. The positioning system increases mechanical stability by essentially eliminating mechanical hysteresis, which allows state of the art electron beam lithography systems to provide the repeatable, accurate and dense circuit patterns that modern semiconductor trends demand.

The positioning system in preferred form comprises a movable positioning table, a workpiece supporting superstructure which is elastically joined to the movable positioning table by three geometrically distinct kinematic support means and a two-stage coupling means which mounts a workpiece (i.e., semiconductor mask or wafer) to the workpiece supporting superstructure. A laser interferometer locating-positioning system is utilized to position the workpiece. The interferometer mirrors are integral with the workpiece supporting superstructure.

The coupling means mounts a workpiece to the workpiece supporting superstructure with a minimum of mechanical distortion. Three two-stage coupling means are utilized in preferred form. The first stage is removable from the positioning, and allows for workpiece loading and unloading outside of the positioning system. The removable stage comprises an integral unit which includes two opposing arms with large radii spherical ends and a tab member. The spherical end center lines are collinear, providing for vertical clamping of the workpiece. The second stage is stationary and integral with the workpiece supporting superstructure. The stationary stage comprises two opposing arms with large radii spherical ends and clamps the tab of the removable stage by vertical clamping.

37 Claims, 9 Drawing Figures

WORKPIECE MOUNTING AND CLAMPING SYSTEM HAVING SUBMICRON POSITIONING REPEATABILITY

TECHNICAL FIELD

This invention relates to high precision submicrometer workpiece positioning equipment. In particular, this invention relates to a high precision workpiece positioning system for use in electron beam lithography applications in the semiconductor industry.

BACKGROUND

DESCRIPTION OF THE PRIOR ART

Electron beam lithography systems provide a fundamental method of pattern generation for large scale integrated circuits (LSI) and very large scale integrated circuits (VLSI). These systems are very useful for making photolithographic masks for optical exposure, as well as direct writing on semiconductor wafers (i.e., defining patterns in resist with an electron beam).

This invention relates to a high precision, submicrometer positioning system, and is concerned particularly, though not exclusively, with a mechanical system for precisely manipulating workpieces within an electron beam lithography system.

A basic electron beam lithography system may include an electron beam source, condenser lenses, demagnification lens stages, a projection lens, a deflection unit, and a target area (see U.S. Pat. No. 3,644,700 issued Feb. 22, 1972 to Kruppa et al). As demands for high throughput and denser circuitry increase, electron beam systems are becoming more complex. For example, movable positioning tables and high precision positioning means such as laser-interferometer positioning sub-systems have been incorporated into electron beam exposure systems.

To achieve the relatively high throughputs required of a manufacturing lithography system, efforts have previously been made to increase the accuracy, and reduce the time involved when transporting workpieces (i.e., wafers, photolithographic plates, or masks), to and from a workpiece holder or fixture which ultimately manipulates the masks, plates or wafers as the electron beam operates on them. U.S. Pat. Nos. 3,874,525 and 3,968,885, both by Hassan et al and assigned to this assignee deal with such a transfer mechanism.

As circuit densities further increase and wafers increase in size (i.e., 82 mm and 25 mm), the problem of producing masks with low mask to mask overlay specifications, while achieving manufacturing level throughputs becomes more significant. To create present day semiconductor devices, approximately 7 to 20 mask overlays are required to form a wafer. If mask to mask overlays are large, then vias and other features may be misaligned, and the specifications required for the dense packaging of devices could not be repeatedly achieved. As wafer and mask sizes increase, the adverse affect on yields increases as mask to mask overlay error increases.

A concise, detailed description of a state of the art electron beam system, of which the problems and background described herein would apply is described in "EL Systems: Throughput Electron Beam Lithography Tools" by R. D. Moore, *Solid State Technology*, September 1983, pp. 127–132. The aggressive performance specifications for the EL-3 system are described in the Moore article, see Tables IV and V, (for example, the mask maker specification calls for throughputs of up to 10 82 mm masks per hour at a current density of 25 amps/cm$^2$, and 0.35 micrometer mask to mask overlay for 1× mode masks). The present invention's major application is to provide the mechanical precision and repeatability to make performance specifications such as those listed in the Moore article possible.

Complex electron beam mask maker systems, such as the system described above, inherently do not produce masks which have no overlay error. The system's mask to mask overlay capability is mainly a function of the accuracy of the electron beam column, electronics associated with the workpiece positioning apparatus (i.e. feedback from interferometer), and mechanical hysteresis (i.e. non-repeatable distortion) in the system. In state of the art systems, mechanical hysteresis accounts for a significant portion of the system's mask to mask overlay differential. In order to have tolerable and repeatable mask to mask overlay capability, mechanical hysteresis must be reduced in a manner that will not adversely effect the electron beam performance (i.e., metals in vicinity of electron beam cause beam deflection). The electron beam pattern generating equipment must be capable of submicrometer repeatability and precision.

Common sources of mechanical hysteresis in a state of the art, high throughput, electron beam mask maker system include friction interfaces, which are found in non-integral bodies or systems comprised of numerous components joined by transient means such as bolts or screws at component interfaces. Friction interfaces decrease system stability due to potential non-repeatable slip at such interfaces. Thermal stresses due to the different thermal expansion coefficients of various system components and forces transmitted due to the movement and imperfections of the movable stage also contribute to mechanical hysteresis.

Friction interfaces, stresses and forces which are transmitted through the system, all affect the stability of the assembled body or structure. This affect becomes more significant for systems and equipment such as the electron beam systems described above, which must be capable of submicrometer precision and repeatability.

From a stability and precision point of view, an integral elastic body is ideal because after being stressed, an integral elastic body will return to its origin when relaxed, thus exhibiting no mechanical hysteresis. Practically, a complex electron beam system, or any complex precision system cannot be made of one integral body. The structures, such as the mechanical positioning structure of the present invention, are assembled with many parts. Thus, emulating the property of an elastic body would minimize instability in a multi-component precision positioning system, such as is required for electron beam system applications.

The versatility of a precision positioning system, (i.e., the system which is described herein contains a mask/wafer coupling means which can handle various size workpieces, and can easily be engaged or disengaged from the supporting platform), may also contribute to mechanical hysteresis, since additional friction interfaces are added for the easy engagement/disengagement of workpieces or carriers.

Mirror surfaces that move with the workpiece are commonly used in a laser interferometer positioning system. In such systems, the distance between the mirror surfaces and the workpiece is critical. If the distance between the workpiece and mirror surface is not substantially fixed (i.e. if movement of the plate occurs once plate writing starts), then the address that the movable stage is sent by the laser interferometer system will not correspond to the workpiece area that the electron beam is supported to write on. If this distance is not substantially fixed, the mask to mask overlay will be adversely affected. Mechanical hysteresis must be minimal so that the distance between the interferometer mirror surface and workpiece can be as close to a fixed distance as possible.

To eliminate mechanical hysteresis, it is desirable to have a stable mechanical system, with as few interfaces as possible, and integral construction made of materials which exhibit elastic properties.

Mechanical stability implies an integral construction, but no single material is completely suitable for the inherent requirements of a high-current electron beam system. The material must not be ferromagnetic, or even paramagnetic or diamagnetic; otherwise the beam can be displaced by the interaction of the material near the high fields of the electron beam lens. The material must be an insulator, or charge accumulation on exposed surfaces could deflect the beam. The material must not be a good bulk conductor, or the magnetic fields generated by eddy currents could deflect the beam.

Failure to meet any of these requirements would result in unacceptable electron beam distortion. These requirements are especially important for the present manufacturing level throughput mask making system, in which high electron beam currents are required. Since metals cannot be used in the proximity of the electron beam, the problem of reducing mechanical hysteresis in the mechanical positioning system is compounded. Alternative materials, such as glasses and plastics, have their own problems (even if plated to drain surface charge). Glass is brittle and fragile. Plastic is relatively unstable; it may flow and relax when stressed, rather than responding elastically.

In view of the compounded problem of reducing mechanical hysteresis due to the material constraints involved in an electron beam system, the problem of maintaining a substantially fixed distance between the interferometer mirrors and workpiece is also compounded. It is of further significance, that the electron beam mask making system described herein has no registration marks as direct wafer write systems do. The main reasons for this are that it is cost effective to not use valuable mask real estate for registration marks, and that throughput is increased if the electron beam can continually write, without consuming time for re-registration steps. Since the mask making electron beam system uses no registration marks, an entire photolithographic plate must be "blind" written, which causes any positioning errors and workpiece movement that are compounded by drift in the fixed distance between the workpiece and the laser interferometer mirror surfaces.

As noted above, a movable stage is used for ultimately positioning the workpiece with respect to the electron beam. Both the acceleration of the movable table (i.e., gravitational acceleration rates and higher are utilized to attain the speeds required for specified high level throughputs), and stage imperfections contribute to mechanical hysteresis in the system. Acceleration and deceleration also contribute to the problem of "ringing", which is the problem which occurs after the stage stops, and it continues to vibrate for a while, during which time the exposure operation must be suspended. U.S. Pat. No. 4,117,240 by Goto et al describes an electron beam exposure system in which the problem of vibration after the stage stops is highlighted. However, the Goto et al patent does not deal with the problem from the point of view of reducing overall mechanical hysteresis in the system. To maintain high level throughputs, the system cannot wait for "ringing" to cease before it starts to write on the photolithographic plate. Furthermore, in accordance with the mechanical constraints and problems described above, all clamping arrangements must not transmit any significant distorting forces to the workpiece (i.e. photolithographic plate) or workpiece supporting superstructure. Conventional clamping means that clamp a flat workpiece (i.e. plate), typically do so with forces applied across the entire length of the workpiece, which introduces distorting forces.

General problems associated with submicrometer dynamic positioning repeatability in electron beam systems and the like have been addressed previously. However, none of the prior art deals with electron beam specifications as aggressive as those of the aforementioned EL-3 system. U.S. Pat. No. 4,103,168 by Sturrock et al concerns reducing unwanted movement between the mirrors and interferometer heads of an electron beam microfabrication apparatus which incorporates an interferometer positioning system. That patent is particularly concerned with reducing unwanted movement between the mirrors and interferometer heads. However, the effect of mechanical hysteresis on the physical relationship between the interferometer mirrors and workpiece (i.e. substrate) is not shown or described. Retaining a substantially fixed distance between the mirrors and workpiece is vital to the present invention. U.S. Pat. No. 3,934,187 by Trotel concerns the interferometer positioning of a substrate. The need for the substrate to be bombarded in a perfectly defined position in relation to the X and Y axes of the interferometer mirrors is recognized, but not shown or described.

U.S. Pat. No. 3,648,048 by Cahan et al describes a system for positioning a wafer and controlling the displacement of the wafer in an electron beam apparatus. The system uses interferometers and piezoelectric actuators to position wafers. The workpiece is adjusted via alignment marks. As stated above, the present invention allows for precise submicrometer repeatability without the use of registration or alignment marks. Many other prior art systems, such as that disclosed in U.S. Pat. No. 4,370,554 rely on registration or alignment marks.

U.S. Pat. No. 3,521,056 by Suzuki concerns a means to correct for thermal stresses in an electron beam system. However, this patent does not concern the problem of mechanical hysteresis.

"A position-controlled rectangular-coordinate table" by Garside and Pickard in the JOURNAL OF PHYSICS, E: Scientific Instrumentation, Vol. 16, March 1983, pp. 223-226 describes a precision positioning system for use with an electron beam apparatus. The system uses laser interferometer measuring to determine the position of an X-Y stage. A work carrier is mounted on the X-Y stage by balls made of a non-ferromagnetic material (sapphire). Workpiece holders are mounted on the work carrier by sapphire balls also. The interferometer mirrors are mounted to the X-Y stage.

The Garside system is not capable of meeting the overall submicrometer precision and throughput levels that the present invention was created to meet. Numerous frictional interfaces, including the sapphire balls, add to the overall mechanical hysteresis of the system. In addition, the interferometer mirror is not in the same plane as the workpiece. Thus, any error at the interferometer mirror is amplified. In sum, Garside provides for submicrometer positioning of an X-Y stage only, and doesn't recognize the problems of overall system precision and repeatability in view of mechanical hysteresis.

In view of the above, it is evident that a need exists for a high precision, submicrometer positioning system for electron beam lithography applications; that provides for high throughputs, low mask to mask overlay errors, low mechanical hysteresis, submicrometer dynamic position repeatability, and which also can continuously position a workpiece without registration marks (i.e. provide for "blind" write), provide for variable sized workpieces, withstand high acceleration forces, and provide non-distorting workpiece clamping.

SUMMARY OF THE INVENTION

It is a primary object of the present invention to provide a high precision submicrometer workpiece positioning system that can handle relatively high throughputs.

It is another object of the present invention to provide a high precision submicrometer workpiece positioning system which can provide an electron beam lithography system with increased throughput and reduced mask to mask overlay errors.

It is another object of the present invention to provide a workpiece positioning system for an electron beam lithography system so that mechanical hysteresis is a minimum, while non-magnetic, non-metallic materials are used to construct any system components within the proximity of the electron beam or workpiece.

It is a further objective of this invention to provide a workpiece positioning system for an electron beam lithography system which includes a laser interferometer sub-system to locate and direct the workpiece with respect to the electron beam, and where the mirrors of the subsystem are at a constant distance from a workpiece.

A still further object is to provide a workpiece positioning system for an electron beam lithography system which can accommodate variable sized workpieces.

A further object is to provide for submicrometer dynamic position repeatability.

A further object is to provide the capability to write continuously with precise repeatability on a photolithographic plate with an electron beam, without the use of reference or registration marks (i.e., "blind write").

A further object of the present invention is to provide a workpiece positioning system for an electron beam lithography system which remains mechanically stable under acceleration forces of at least 1G, and minimizes the effect of "ringing" after deceleration.

A final object of the present invention is to provide a mechanical positioning system for an electron beam lithography system in which all mechanical clamping and support arrangements do not transmit any significant distortion or strain to other system components.

Briefly, the preferred embodiment of the high precision, high throughput submicrometer workpiece positioning system of the present invention comprises; a movable positioning table, a workpiece supporting superstructure, a locating-positioning means (i.e. laser interferometer system) for directing the movable positioning table, three distinct kinematic support means which elastically join the workpiece supporting superstructure to the movable positioning table, and three two stage cooling means which join a workpiece to the workpiece supporting superstructure.

The term "kinematic support" describes a purely elastic support designed to allow movement only in certain directions.

The first of the kinematic support means comprises a short flexible column constraining three degrees of freedom. The center of that short column is essentially fixed in space, but flexure permits three degrees of freedom in rotation about that point.

The second kinematic support means comprises a flat spring member constraining two degrees of freedom. Displaced from the first kinematic support means, the two-directional displacement constraint provided by this member actually constrains two of the three rotational degrees of freedom still allowed by the first kinematic support. Only one degree of rotational freedom remains.

The third kinematic support means comprises a relatively long, thin column (or a column with two separated thin, short sections) that strongly resists only compression and extension. This column, displaced from the other two kinematic supports, constrains the final degree of freedom.

The mirrors for the laser interferometer system are integral with the workpiece supporting superstructure. The two stage coupling means each comprise a first stage which is removable from the workpiece positioning system, and a second stage which is stationary and integral with the workpiece supporting superstructure. The removable stage includes a tab element, and two opposed arms having spherical contact ends, the first arm being fixed to form a reference surface and the second arm resiliently mounted to form a clamp with the first arm. The clamp engages and retains the workpiece. The removable stages are all connected to each other by a workpiece carrier. The workpiece carrier and removable stages serve as an interface to transfer the workpiece to and from the positioning system. The stationary stage includes two opposing arms having spherical contact ends, the first arm being affixed to the workpiece supporting superstructure to form a reference surface, and the second arm being resiliently mounted to form a clamp with the first arm. The clamp retains the tab element of the removable stage. An alternative preferred embodiment comprises two two-stage coupling means as described above, and a third two-stage coupling means which does not include a resiliently mounted second arm.

The foregoing and other objects, features and advantages of the present invention will be apparent from the following more particular description of the preferred embodiments of the invention, as illustrated in the accompanying drawings.

BRIEF DESCRIPTION OF THE DRAWINGS

The details of this invention will be described in connection with the accompanying drawings, in which.

DESCRIPTION OF THE PREFERRED EMBODIMENTS

Figure 1A:
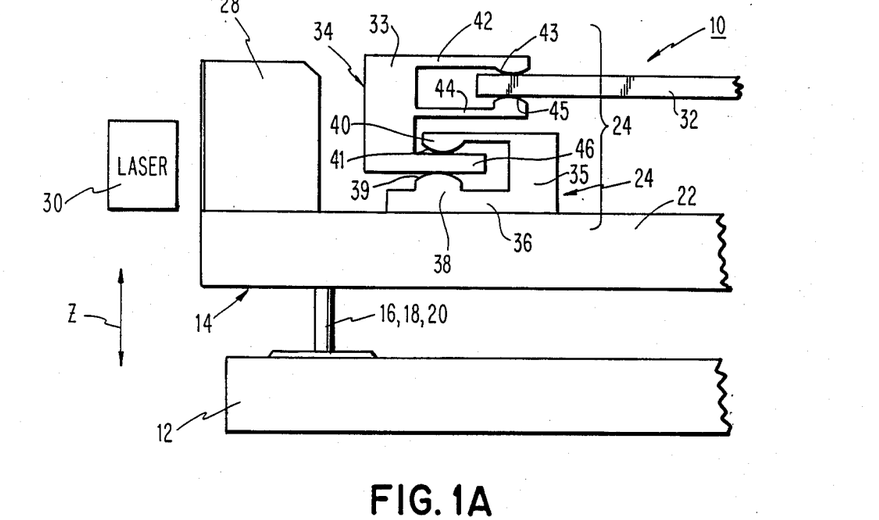
FIG. 1A is a schematic of the overall system.
Figure 1B:
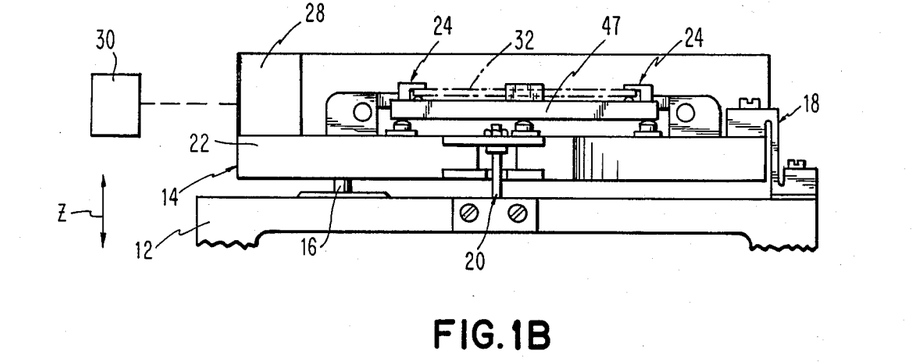
FIG. 1B is a front elevation of the overall precision workpiece positioning system.

The high precision submicrometer workpiece positioning system 10 of the present invention is shown in FIGS. 1A and 1B. The dimensional stability of the mechanical structure 10 is maximized due to the novel features of the present invention. The main embodiment of the present invention is utilized as a mechanical subsystem of an electron beam lithography tool for use in the semiconductor industry. The precision positioning system is particularly useful in the manufacture of photolithographic masks, which are the end product when photolithographic plates are exposed to an electron beam in a desired pattern.

The system shown in FIGS. 1A and 1B comprises primarily; a movable positioning table 12; a workpiece supporting superstructure 14, which is attached to the movable positioning table 12 by three kinematic support means 16, 18, 20 and a two-stage coupling 24 which ultimately mounts a workpiece 32 onto the superstructure 14. The superstructure 14 is comprised of a base 22 and positioning mirrors 28. The mirrors 28 act as the reflecting means for a laser interferometer 30, which serves as the position locator for directing the movable positioning table 12.

Figure 2:
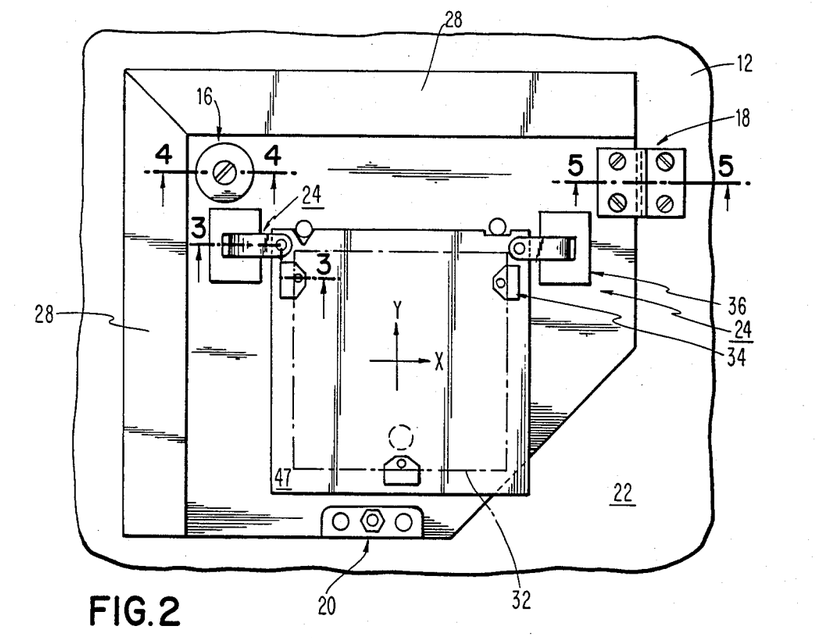
FIG. 2 is a plan view of the workpiece positioning system.

The movable positioning table 12 is of the conventional type, typically found in high precision electron beam lithography systems. The table 12 may be movable either orthogonally in the X and Y Cartesian coordinates, or the X, Y and Z Cartesian coordinates. (The X, Y and Z coordinates are orthogonal, the X and Y coordinates define the plane parallel to the surface of the table 12, whereas the Z coordinate is normal to the plane of the movable positioning table 12. The coordinates used herein are illustrated in FIGS. 1A, 1B and 2).

The base 22 of the workpiece supporting superstructure 14 is made of substantially non-magnetic material, to avoid perturbation of the electron beam. The base 22 and other system components in the proximity of the electron beam such as the workpiece (i.e. semiconductor wafer, photolithographic plate or mask) coupling 24, should not be ferromagnetic and should not exhibit any magnetic properties greater than a 0.002 gauss residual magnetic field strength (i.e. magnetic hysteresis) after an applied magnetic field is applied, then removed.

If magnetic hysteresis is too high, unacceptable electron beam distortion will occur. In addition, if the base 22, or any other part of the workpiece supporting superstructure 14 which is in the proximity of the electron beam, is made with a high metallic content, eddy currents will distort the electron beam. The adverse affects of utilizing metals in the proximity of the workpiece or electron beam are compounded as electron beam current is increased. Since the present invention is to be utilized with high throughput electron beam systems, which require high electron beam currents, the use of bulk metals in the vicinity of the workpiece is generally unacceptable.

Mirrors 28 which provide the reflecting means which work in conjunction with a conventional commercially available laser interferometer 30 may either be bonded to the base 22 of the workpiece supporting superstructure 14 or may be part of an integral workpiece supporting superstructure 14 in which the base 22 and mirrors 28 are formed from a single piece of material. The present invention utilizes low expansion material such as commercially available Corning Ultra Low Expansion glass (ULE) to form the base 22 and the positioning mirrors 28 of the workpiece supporting superstructure 14. The workpiece supporting superstructure 14 is inherently nonconducting (to avoid eddy currents) but is metal-coated to prevent undesired surface charge accumulation, that adversely affects the electron beam. It is obvious to one skilled in the art that other materials of low metallic mass, low mechanical hysteresis and a low coefficient of expansion may be used to manufacture the workpiece supporting superstructure 14.

The primary features of the present invention which allow for repeatable for submicrometer positioning and high throughputs of workpieces patterened by an electrom beam system are the kinematic support means which join the workpiece supporting superstructure 14, to the movable positioning table 12 and the coupling means 24 which ultimately mounts the workpiece 32 to the workpiece supporting superstructure 14. These features particularly solve the mechanical stability problems due to the aforementioned material and system constraints, and provide for high throughputs demanded of state of the art electron beam systems such as the EL systems described in the Moore article previously referred to in the background section. Table V from the Moore article is partially exhibited here to demonstrate aggressive state of the art specifications. To achieve specifications such as these and even more stringent specifications which future systems will require, maximum mechanical stability of the workpiece positioning system, as well as low electron beam distortion, is required.

TABLE V

| EL-3 Specifications: 82 MM Array, 1X Mode Mask Maker | | |
|---|---|---|
| Mask-to-Mask Overlay (3 $\mu$m) | 0.35 $\mu$m | 0.25 $\mu$m |
| Current Density | 25 A/cm$^2$ | 6 A/cm$^2$ |
| Mask Capabilities | up to 6" | up to 6" |
| Throughput Per Hour | 10 | 4 |

The kinematic supporting means 16, 18, 20 each exhibit unique geometric structures which contribute to the system's mechanical and dimensional stability. They elastically constrain the workpiece supporting superstructure 14 so that any deflections that may occur due to mechanical or thermal stresses are not permanent.

Elastically joining with a minimum number of constraints increases mechanical stability and reduces mechanical hysteresis. The three kinematic support means 16, 18, 20 are of equal effective length, and elastically connect the movable positioning table 12 and workpiece supporting superstructure 14 so that they are mutually parallel. The kinematic support means 16, 18, 20 are sufficiently rigid with respect to their longitudinal axes to support the superstructure 14, but are elastically flexible transversely (i.e. in bending). When utilized according to the teachings of the present invention, the kinematic support means 16, 18, 20 meet their objective of minimizing the effect of distortions and stresses caused by the movable positioning table 12 on the superstructure 14.

Figure 4:
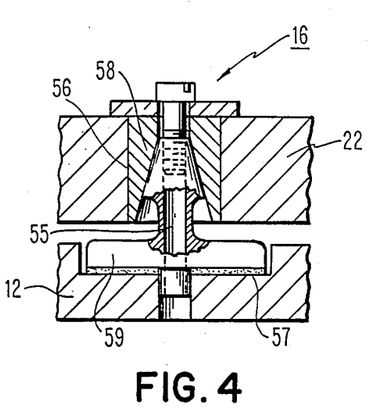
FIG. 4 is a front elevation view, which represents an alternate form of the first kinematic support means in detail.
Figure 5:
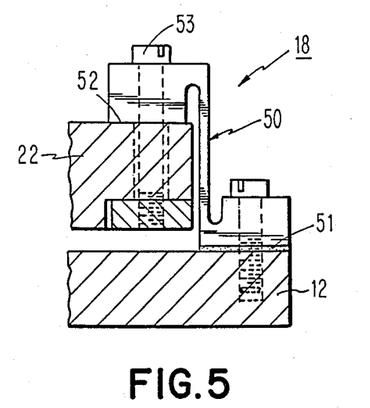
FIG. 5 is a front elevation view which represents the second kinematic support means in detail.

The kinematic support means 16, 18, 20 are shown in one elevation in FIG. 1B, and in plan view in FIG. 2. Details are shown in FIGS. 4 and 5. Functionally, the kinematic support means are a plurality of supports, three in peferred form, each of which is geometrically selected to constrain movement of the workpiece supporting superstructure 14, in one or more degrees of freedom. The three kinematic support means in preferred form constrain the six degrees of freedom, namely, linear translation in the X, Y and Z Cartesian coordinate directions, wherein the X and Y directions are orthogonal to each other and parallel to the movable positioning table 12, while the Z direction is perpendicular to the movable positioning table 12; plus rotation around each of the X, Y and Z axes (i.e. torsion). The ends of each kinematic supporting means 16, 18, 20 are joined respectively to the movable positioning table 12 and workpiece supporting superstructure 14.

The first kinematic supporting means 16 constrains linear X, Y and Z translation without strongly resisting small rotations about any axis. The second kinematic supporting means 18, a leaf spring member in preferred form, constrains any rotation or torsional displacement that may occur around the Z axis of the first kinematic supporting means 16. The third kinematic supporting means 20 is a thin rod or column, which resists axial forces, and constrains the workpiece supporting superstructure in the Z Cartesian direction.

This combination of geometrically different kinematic supporting means provides the rigidity required to support the workpiece supporting superstructure 14, while utilizing a minimum number of constraints. By not over constraining the workpiece supporting superstructure 14, distortions due to stresses and forces transferred from the movable positioning table 12 to the superstructure 14 ar minimal.

In particular, the kinematic supporting means 16, 18, 20 cooperatively function as follows. The first kinematic support means 16, which is sufficiently rigid longitudinally, i.e. contrains movement in the X, Y and Z Cartesian directions, and flexible in torsion serves as the first geometric locus for the workpiece supporting superstructure. The second kinematic support means 18 is also rigid longitudinally, and the bending rigidity with respect to the kinematic amounts major axis (i.e. the Z Cartesian axis) matches or exceeds the flexibility of the first kinematic support means 16; thereby constraining rotation of the workpiece supporting superstructure 14 about the first kinematic support means 16 and establishing a second geometric locus. The workpiece supporting super structure 14 is still free to move in one degree of freedom, namely rotational deflection about the X Cartesian axis when supported by only the first and second kinematic support means 16, 18. Thus, the third kinematic support means 20 is a rod or column with a high slenderness ratio which is elastic in bending, but supports the workpiece supporting superstructure 14 in the Z Cartesian direction; thus providing the third geometric locus to fix the workpiece supporting superstructure 14 elastically in a plane parallel to the movable positioning table 12.

In addition to minimizing distortion to the workpiece supporting superstructure 14, the kinematic support means 16, 18, 20 reduce the effects of "ringing", so that an electron beam column (not shown) can operate as soon as the movable positioning table 12 and workpiece 32 are in position, and does not have to wait for "ringing" or vibrations to cease.

The particular structural details of the kinematic support means 16, 18, 20 which allow for the elastic and mechanically stable connections between the superstructure 14 and movable positioning table 12, are described as follows, and best shown in FIGS. 4 and 5.

The first kinematic support means 16 comprises a column in preferred form. The column is made of a non-magnetic material, and is bonded to both the workpiece supporting superstructure 14 and the movable positioning table 12 to form an elastic joint. The geometric dimensions of the column are a function of many factors, the most important of which are the mass of the workpiece supporting superstructure 14, the speed and acceleration of the movable positioning table 12, and the material which the first kinematic support means 16 is made of. For the specific application that the present invention was built for, wherein the movable stage acceleration force is approximately 1 G, the mass of the workpiece supporting superstructure 14 is approximately 10 pounds, and the kinematic amount 16 is made of aluminum; the dimensions of the first kinematic mount are approximately 0.25 in diameter, and 0.35 in. in length. A more universal approach for defining the geometric dimensions of the first kinematic support means 16 is to compare the bending rigidity (K) of a column, to the torsional rigidity ($K_t$).

$$\text{Bending Rigidity} = K = \frac{3 \cdot E \cdot I}{l^3}$$

E = Modulus of Elasticity
I = Moment of Inertia
l = Column length $$\text{Torsional Rigidity} = K_t = \frac{G \cdot I_p}{l}$$

G = Shearing Modulus of Elasticity
Ip = Polar Moment of Inertia
l = Column Length The bending rigidity (K) has units of force per unit distance, which are the same units as a spring rate (force/distance). Thus, the bending rigidity (K) may be considered a spring rate for resisting lateral displacement. The units of torsional rigidity ($K_t$) are different, namely moment per unit angle. In order to properly compare bending rigidity (K) and torsional rigidity ($K_T$), the units should be the same. Introducing a moment arm expression into the torsional rigidity equation to modify the torsional rigidity into an effective spring rate for torsion accomplished this. In particular, dividing the torsional rigidity ($K_T$) by the square of a moment arm, (i.e. moment arm will be designated as R), results in the same units as bending rigidity, namely forces per distance.

i.e. $\dfrac{K_T \text{(torsinal rigidity)}}{R^2 \text{ (moment arm}^2)} = \dfrac{\text{force}}{\text{distance}}$ $K \text{ (bending rigidity)} = \dfrac{\text{force}}{\text{distance}}$ $\text{spring rate} = \dfrac{\text{force}}{\text{distance}}$ As indicated above, the expression $K_T/R^2$ is called the effective spring rate for torsion.

To quantify the functionality of the first kinematic mount, a specific moment arm (R) must be used to directly compare the two distinct rigidity terms, K and $K_T$. For a value of R equal to the distance between the first kinematic mount and the second kinematic mount, the bending rigidity (K) should be must larger than the effective spring rate for torsion ($K_T/R^2$).

As an example, for first kinematic mount described on line 37 of page 18 and line 1 of page 19, wherein the dimensions are 0.25 inches in diameter, and 0.35 in. in length; the ratio of K (bending rigidity) to $K_T/R^2$ (effective spring rate for torsion) is approximately 1000. This ratio may typically be low as 150.

Without the second and third kinematic support means 18, 20 are first kinematic support means 16 that meets this criteria is not capable of constraining the workpiece supporting superstructure 14 in all six degrees of freedom. This is a desired result because the second and third kinematic support means 18, 20 functionally cooperate with the first kinematic support means 16 to constrain the superstructure 14 in all six degrees of freedom.

If the first kinematic support means 16 over constrains the superstructure 14, then distorting forces from the movable stage 12 are readily transmitted to the superstructure 14.

The second kinematic support means 18 comprises a spring member 50 whose longitudinal axis is parallel to the Z axis preferred form. The spring member 50 may be a flat leaf spring or a column which exhibits spring-like properties. The second kinematic support means 18 is made of a non-magnetic material, and is bonded to the superstructure 14 and solidly bolted to the movable positioning table 12 to form an elastic but adjustable joint. The geometric dimensions of the spring member are approximately 0.05 inches long by 0.75 inches wide by 1.125 inches long for the specific application described above. A universal approach for defining the geometric dimensions of the second kinematic support means 18 is to compare the bending rigidity around the X axis of the spring member (Kx) to the bending rigidity around the Y axis of the spring member (Ky).

---

Bending Rigidity (X axis) = $Kx = \frac{3EIx}{l^3}$

E = Modulus of Elasticity
Ix = Moment of inertia about x axis
l = flexible length Bending Rigidity (Y axis) = $Ky = \frac{3EIy}{l^3}$ E = Modulus of Elasticity
Iy = Moment of Inertia about Y axis
l = flexible length

---

The second kinematic support means 18 should be of geometric dimensions such that the ratio of bending rigidity around the X axis (Kx) to the bending rigidity around the Y axis (Ky) is in the range of approximately 150 to 350. The second kinematic support means 18, constructed in accordance with the above bending rigidity ratios will be rigid enough in torsion to resist any rotation about the first kinematic mount 16. Thus, the second kinematic support means 18 will be capable of constraining torsional displacement around the Z axis of the first kinematic support means 16 as well as constraining relative linear displacement of the workpiece supporting superstructure 14 in the Y and Z Cartesian coordinate directions.

The third kinematic support means 20 is a column in preferred form which is made of a non-magnetic material. The kinematic support means 20 is joined to both the workpiece supporting superstructure 14 and the movable positioning table 12, forming an elastic joint. For the specific application described above the geometric dimensions of the column are approximately 0.01 inch in diameter by 0.85 inches long. The column is free to flex in any direction, yet restrains relative movement of the workpiece supporting structure 14 in the Z Cartesian coordinate direction. A more universal approach is to define the third kinematic support means 20 by defining a column by its slenderness ratio.

---

Slenderness ratio (S) = $\frac{4L}{d}$

L = length of column
d = diameter of column

---

The third kinematic support means 20 should be of geometric dimensions such that the slenderness ratio (S) is in the range of approximately 20 to 50. If so, the third kinematic support means will flex freely enough to not over constrain the workpiece supporting superstructure 14 when combined with the first kinematic support means 16 and the second kinematic support means 20 to support the superstructure 14.

Thus, the combination of the three kinematic support means 16, 18, 20 as described above, elastically joins the superstructure 14 to the movable positioning table 12 with a minimum number of constraints.

The above descriptions of the kinematic supporting means 16, 18, 20 in terms of general description and rigidity ratios, apply in general to any precision positioning system. However, the specific geometric dimensions stated above apply to positioning systems whose superstructures weigh less than approximately 15 pounds. The superstructures (i.e. structure supported by a movable table) of most electron beam lithography systems do not exceed 15 pounds. In precision positioning systems which do have superstructures of greater than 15 pounds, the general description of the kinematic mounts 16, 18, 20 would still apply, but specific lengths, diameters and other geometric features would be redefined. Given the teachings of the present invention, one skilled in the art may utilize the present invention for the superstructures of greater than 15 pounds.

The kinematic support means 16, 18, 20 should be made of non-magnetic materials which are elastic at room temperature. The material used may be metal, since it is not in the direct proximity of the workpiece or electron beam. Metals provide sufficient rigidity to support the workpiece supporting superstructure 14, and most metals exhibit excellent elasticity at room temperature. The main embodiment of this inventon utilizes aluminum, but other metals such as beryllium-copper alloys, titanium or cemented carbides are suitable. It is obvious to one skilled in the art that materials other than those listed herein may satisfy the property requirements specified for the kinematic support means.

FIG. 5 shows the details of a typical installation of the second kinematic support 18 which comprises at least a flat spring member 50. The flat spring member 50 is bonded to the base 22 of the workpiece supporting superstructure 14 at a superstructure base interface bond 52, and is joined to the movable stage 12 at a movable stage interface joint 51. Reinforcing means such as bolts or rivets 53 to reinforce the joints 51 and 52 may be utilized for adjustment or disassembly, but are not required. The joints formed here emulate an integral elastic body while permitting the assembly of discrete system components.

FIG. 4 represents an alternative embodiment of the first kinematic support means 16. This embodiment allows for ease of assembly. This first kinematic support means, as shown, is made of a tapered conical top portion 58, which provides for greater bonding area, a mid-section 55, which may be hollow or solid, and a wide base member 59 which also provides for greater bonding area. The first kinematic support means 16 is bonded to the base 22 of the superstructure 14 at a superstructure base interface bond 56 and is bonded to the movable positioning table 12 at a movable positioning table interface bond 57. It is obvious to one skilled in the art to modify the specific geometry shown in order to accomplish the elastic emulation taught by the present invention.

In conjunction with the requirement of overall system mechanical stability, which demands minimum mechanical hysteresis, and that the distance from the workpiece 32 to the mirrors 28 be fixed, the manner in which the workpiece 32 is coupled with the workpiece supporting superstructure 14 is of prime importance since any distortion of the workpiece 32 will result in a change in the distance between the workpiece 32 and the mirror 28.

Figure 3:
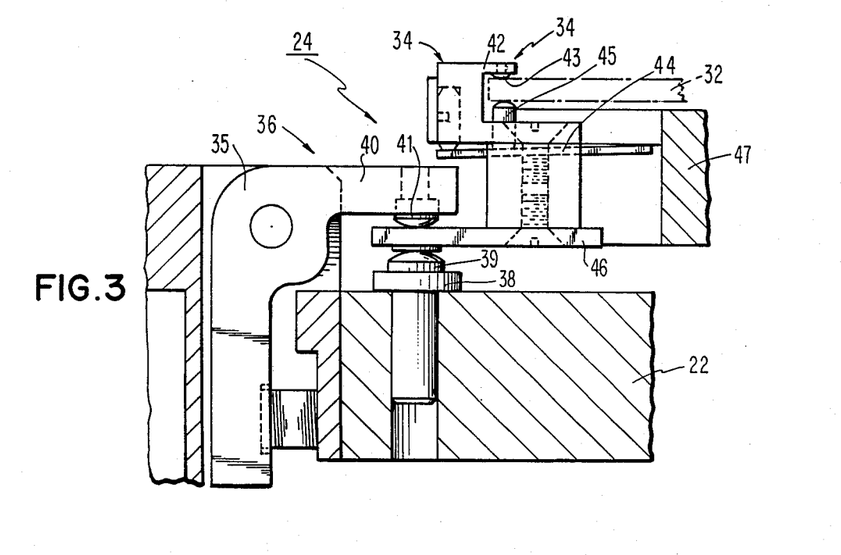
FIG. 3 is a front elevation view of the two-stage coupling means.

See FIG. 1 for the functional relationship of the coupling means 24 to the overall positioning system 10 and see FIG. 3 for coupling 24 details. The coupling means 24 of the present invention can receive variable sized workpieces 32 and mount them precisely on the workpiece supporting superstructure 14 without causing any distortion to the workpiece 32.

In preferred form, the coupling means are three two-stage coupling means 24. The first stage is a removable stage 34 which includes two opposed arms 42 and 44 having spherical contact ends 43 and 45, respectively, and a tab element 46. One arm 42 is fixed to form a reference surface and the second arm 44 is resiliently mounted to the removable stage body 33 forming a clamp with the first arm 42 which retains a workpiece 32. Only the spherical contact ends 43 and 45 contact the workpiece 32. The center lines of the spherical contact ends 43 and 45 are coaxial and perpendicular to the workpiece 32 so that the forces exerted by each opposing arm 42, 44 do not result in a moment or torque which can distort the workpiece. This coupling technique is referred to as vertical clamping. To hold a workpiece 32 stable in a lateral plane, especially a workpiece which is extremely subject to dislocations such as a photolithographic plate or semiconductor wafer, the use of vertical clamping and the application of clamping forces normal to the lateral plane minimizes dislocating forces, so that no unnecessary mechanical or thermal stresses are introduced to the workpiece 32. The large radii spherical surface clamp ends 43, 45 effectively spread the applied clamping force over a sufficient area that no localized surface damage occur on the workpiece 32 at the clamping locations. The large radii spherical ends 43, 45 also allow the workpiece 32 to be clamped with a minimal applied force while allowing no relative movement at the clamping points due to external forces such as those caused by movable positioning table 12 accelerations. Thus, the coupling of the workpiece 32 to the removable stage 34 of the coupling means 24 allows the workpiece 32 to remain in a stress free state. The removable stages 34 are all connected to each other by a workpiece carrier 47 (see FIG. 2). The workpiece carrier 47 material must meet the low magnetism, low metallic mass criteria stated above since the carrier 47 is located directly under the workpiece 32. Plastics, such as glass-filled polyphenylene sulfide and low expansion glasses such as Corning (ULE) low expansion glass, are acceptable materials when metal plated to avoid surface charging. The workpiece carrier 47 and removable stages 34 serve as an interface to transfer variable sized workpieces to and from the positioning system 10.

To hold the workpiece 32 stable in relation to the locating mirrors 28 and allow for variable sized workpieces, the removable stage 34 of the coupling means 24 is removably received in the stationary stage 36 of the coupling means 24 in a similar manner as the workpiece 32 is removably received in the removable stage 34 of the coupling means 24. The tab element 46 of said removable stage 34 is held in place by vertical clamping by the stationary stage 36 of the two stage coupling means 24.

Each stationary stage 36 includes two opposed arms 38, 40 having spherical contact ends 39, 41, respectively. The lower arm 38 is affixed to the workpiece supporting superstructure base 22 to form a reference surface and the other arm 40 is resiliently mounted to the stationary stage body 35, forming a clamp with the lower arm 38 for retaining the first stage tab element 46. In a manner similar to that of the removable stage 34 only the spherical contact ends 39 and 41 of the stationary stage 36 contact the tab element 46.

The actual coupling 24 structure is best shown in FIG. 3. The reference arm 42 of the removable stage 34 is contained within the same integral structure as the opposite resilient arm 44 and tab element 46. The reference arm 38 of the stationary stage 36 is contained within an integral structure with the opposing resilient arm 40. The spherical surfaces 45 of the removable stages 34 are on horizontal cantilever springs 44 which are also attached to the body of the removable stage 34. Since both stages 34, 36 of the coupling means 24 are integral structures, all clamping forces are constrained within their respective stages. There is no transmission of strain to associated system components.

Figure 6:
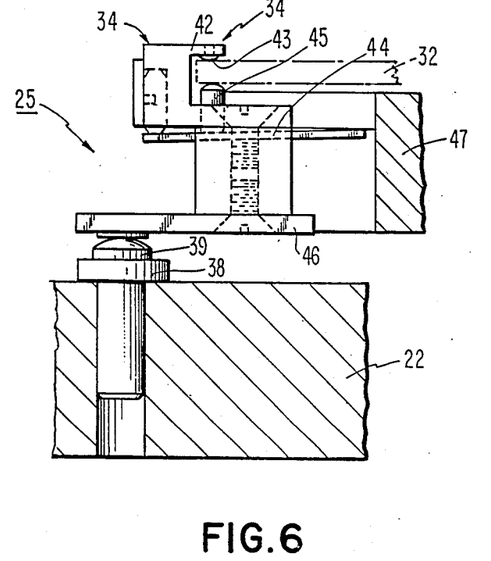
FIG. 6 is an elevation view of an alternate two-stage coupling means.

An alternate preferred form of the coupling means (see FIG. 6) comprises two two-stage coupling means 24 identical to those described above and a third two-stage coupling means 25 which is identical to the two-stage coupling means 24 described above except that the third two-stage coupling means 25 has no resiliently mounted upper arm 40 on the stationary stage 36. This alternate preferred form allows simple insertion and removal of the tab element 46, while being adequate to hold the tab element 46 in place. The adverse affects of thermal expansion are also reduced by this alternative preferred form.

The two-stage coupling means 24, 25 described above provide for minimal distortion of the workpiece 32 while allowing variable sized workpieces 32 and complementary carriers 47 to be quickly loaded and unloaded from the workpiece supporting superstructure 14. The reduction in load/unload time is a significant contributor to achieving desired manufacturing level throughputs such as those required for the aforementioned EL-3 system.

Figure 7:
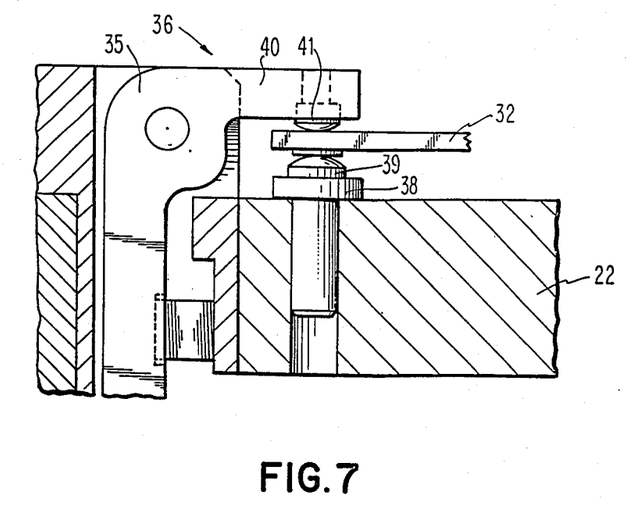
FIG. 7 is an elevation view of a single stage coupling means.
Figure 8:
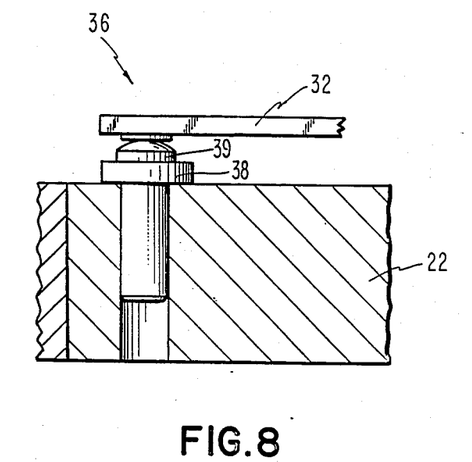
FIG. 8 is an elevation view of an alternate single stage coupling means.

However, not all high precision submicrometer positioning systems may require the two-stage architecture described above. For systems in which a workpiece 32, without workpiece carrier 47 can be directly entered into the system (i.e., without first loading into a removable stage as described above), a single stationary coupling 36 (see FIG. 7) may be used. The single stationary coupling 36 is identical to the stationary stage 36 described above for the two-stage mounting means 24, FIG. 1A. Two alternative forms are three stationary couplings 36 as shown in FIG. 7 or two stationary couplings 36 as shown in FIG. 7 plus one stationary coupling as shown in FIG. 8, which has no resiliently mounted upper arm 40 on the stationary coupling 36.

In sum, the main embodiment of the submicrometer positioning system 10 of the present invention provides: a movable positioning table 12 that is elastically joined with a workpiece supporting superstructure by three geometrically different kinematic support means 16, 18, 20; and joined with a workpiece 32 by a two-stage coupling means 24. The number of friction interfaces in the positioning system 10 is reduced to a minimum; for example, friction interfaces only remain where the workpiece 32 must be loaded and unloaded and where the removable stage tabs 46 are coupled to the stationary stage clamps 36. These remaining friction interfaces facilitate the positioning and clamping of a workpiece 32 to the removable stage clamp 34 of the two-stage coupling means 24 before the removable stage enters the submicrometer positioning system 10. The main embodiment of the workpiece supporting superstructure 14 including the base 22 is comprised of a low expansion glass material wherein the mirror 28 (i.e., reflecting means for interferometric location and control) is an integral part of the workpiece supporting superstructure 14, thus further limiting workpiece position error due to mechanical distortion. The aforementioned kinematic support means 16, 18, 20 not only provide an elastic joint between the movable positioning table 12 and the workpiece supporting superstructure 14 without over constraining the superstructure 14, but they also prevent transmission of strain or distortion which may be induced by the movable positioning table 45 from being transmitted to the superstructure 14. The two-stage coupling 24 applies only normal forces in order to vertically clamp the workpiece 32 to the first removable stage 34 and to vertically clamp the first removable stage 34 to the second stationary stage of the two-stage coupling means 24. The large radii spheres 39, 41, 43, 45 further provide for precise clamping with a minimal applied force. The advantages of vertical clamping and large radii spheres are also realized if a single stationary coupling means is utilized.

The positioning system 10 successfully emulates an elastic body providing for submicrometer dynamic position repeatability. When the two-stage coupling means 24 is utilized, variable sized workpieces 32 may be used without inconvenience or process time delays, since the workpieces are loaded into the removable stage 34 outside of the positioning system 10 and then the first stage is mounted to the stationary stage 36 by an automatic transfer means which is outside the scope of this invention. However, the present invention may be used with a single stage coupling means 36 in systems whose architecture doesn't call for external workpiece mounting. The electron beam lithography system specifications mentioned above in Tables IV and V for the EL-3 system are attainable when the present invention 10 is utilized, whereas prior art positioning systems could not satisfy those objectives and specifications.

The overall results are that mechanical hysteresis is reduced so that the distance from the center line of the workpiece 32 to the mirror 28 is substantially fixed (i.e., 0.02-0.06 micrometers slip), while utilizing materials that do not adversely affect an electron beam. The resulting mechanical stability and accurate, non-deflected electron beam combine to provide for very low mask to mask overlay errors, (i.e., less than 0.3 micrometers). In addition, high throughputs are possible because workpieces 32 can be quickly loaded and unloaded, the movable positioning table 12 can move at high accelerations (i.e., approximately gravitational acceleration, 32.2 ft/sec$^2$), the effect of "ringing" is significantly reduced by the kinematic support means 16, 18, 20 so that an electron beam may be applied to a workpiece 32 without waiting for periods of "ringing" to cease, and high electron beam current densities may be used because there are no materials in the vicinity of the electron beam which significantly distort the beam.

The high precision, high throughput submicrometer positioning system 10 of the present invention is particularly useful as a mechanical subsystem for use in electron beam lithography systems, but the design is adaptable to other uses where high precision position is critical.

While the invention has been particularly shown and described with reference to the preferred embodiments and examples above, it will be understood by those skilled in the art that various changes in form and details may be made therein without departing from the spirit and scope of the invention.

What is claimed is:

1. A workpiece positioning system for substantially avoiding mechanical hysteresis and providing accurate and precisely repeatable movement of a workpiece with respect to an associated apparatus which operates on the workpiece, comprising:
   a movable positioning table;
   a workpiece supporting superstructure;
   coupling means for mounting said workpiece to said workpiece supporting superstructure; and
   a combination of at least three passive elastic kinematic support means for joining said workpiece supporting superstructure to said movable positioning table, each of said support means being selectively in at least one direction which is desired to be fixed and compliant in all uncontrolled directions; containing different degrees of freedom of movement of said superstructure such that all six degrees of freedom are fixed without redundantly fixing any degree of freedom, so that said superstructure is not over-constrained;
   whereby mechanical hysteresis of said workpiece with respect to said associated apparatus which operates on said workpiece is substantially avoided.

2. The system of claim 1 wherein said kinematic support means comprises:
   a first support means joining said workpiece supporting superstructure to said movable positioning table, wherein said first support means constrains relative linear deflection of said workpiece supporting superstructure at a first location while allowing torsional deflection of said superstructure in any direction around said first location;

a second support means at a second location spaced along a reference axis from said first support means, joining said workpiece supporting superstructure to said movable positioning table, wherein said second support means constrains relative linear deflection of said workpiece in a first plane; said first plane being perpendicular to said reference axis at said second location, while permitting linear deflection along said reference axis and torsional deflection in any direction around said second location; and a third support means at a third location spaced apart from said reference axis, joining said workpiece supporting superstructure to said movable positioning table, wherein said third support means constrains relative linear deflection of said superstructure in a direction perpendicular to a second plane containing said reference axis and said third location, while permitting linear displacements parallel to said second plane and torsional deflection in any direction around said third location.

3. The system of claim 2 wherein said second support means comprises:

a column that elastically joins said workpiece supporting superstructure to said movable positioning table;

said column providing a restraining force perpendicular to said reference axis that is at least 150 times greater than said spring member's restraining force parallel to said reference axis.

4. The system of claim 2 wherein said second support means comprises:

a flat spring member that elastically joins said workpiece supporting superstructure to said movable positioning table;

said spring member providing a restraining force perpendicular to said reference axis that is at least 150 times greater than said spring member's restraining force parallel to said reference axis.

5. The system of claim 2 wherein said first, second and third kinematic support means are elastically secured to both said movable positioning table and to said workpiece supporting superstructure.

6. The system of claim 1 further comprising a locating means for directing the movement of said movable positioning table.

7. The system of claim 2 wherein said first kinematic support means comprises:

a column that is elastically joined to said movable positioning table and to said workpiece supporting superstructure, and which has a ratio of bending rigidity to effective spring rate for torsion of at least 150.

8. The system of claim 2 wherein said third support means comprises:

a column that is elastically joined to said movable positioning table and to said workpiece supporting superstructure.

9. The system of claim 8 wherein said column has a slenderness ratio in the range of approximately 20 to 50.

10. The system of claim 2 wherein said coupling means comprises a plurality of coupling means, each including two opposing arms having spherical contact ends, the first arm being affixed to said workpiece supporting superstructure to form a reference surface, and the second arm being resiliently mounted to form a clamp with said first arm, wherein the workpiece is retained therebetween.

11. The system of claim 10 wherein the center lines of said spherical contact ends are approximately coaxial, and approximately parallel to the Z Cartesian axis.

12. The system of claim 11 having three coupling means.

13. The system of claim 12 wherein said second arm of one of said coupling means is replaced by a weaker restraining means sufficient to maintain contact between said workpiece and said reference surface on said first arm.

14. The system of claim 1, 2, 3, 4, 5, 6, 7, 8 or 9 wherein said coupling means which mounts the workpiece to the workpiece supporting superstructure comprises:

a plurality of two stage coupling means wherein a first removable stage includes two opposed arms having spherical contact ends, the first arm being fixed to form a reference surface and the second arm resiliently mounted to form a clamp with said first arm to thereby engage and retain said workpiece; and a tab element which is engaged and retained in a second stationary stage of said coupling means; and wherein said stationary stage includes two opposing arms having spherical contact ends, the first arm being affixed to said workpiece supporting superstructure to form a reference surface, and the second arm being resiliently mounted to form a clamp with said first arm to thereby engage and retain said tab element whereby said stage can be removably received in said stationary stage.

15. The system of claim 14 wherein the center lines of said spherical contact ends of said removable stage are approximately coaxial, and approximately parallel to the Z Cartesian axis; and wherein the center lines of the said spherical contact ends of said stationary stage are approximately coaxial and approximately parallel to the Z Cartesian axis.

16. The system of claim 15 wherein there are three two stage coupling means.

17. The system of claim 16 wherein said second arm of one of said coupling means is replaced by a weaker restraining means sufficient to maintain contact between said workpiece and said reference surface on said first arm.

18. The system of claim 4, 11 or 15 wherein said locating means for directing the movable positioning table comprises a laser interferometer system.

19. The system of claim 18 wherein a reflecting means which interacts with the laser interferometer is an integral part of said workpiece supporting superstructure.

20. The system of claim 1, 11 or 15 wherein said apparatus which operates on a workpiece is an electron beam column, and said workpiece is a photolithographic plate or a semiconductor wafer.

21. The system of claim 20 wherein said plurality of two stage coupling means and said workpiece supporting superstructure are made of non-ferromagnetic materials which exhibit a residual magnetic field of less than 0.002 gauss after being exposed to a strong magnetic field.

22. A workpiece positioning system for substantially avoiding mechanical hysteresis and providing accurate and precisely repeatable movement of a workpiece with respect to an associated apparatus which operates on the workpiece, comprising:
- a movable positioning table;
- a workpiece supporting superstructure;
- support means for joining said workpiece supporting superstructure to said movable positioning table;
- locating means for directing the movement of said movable positioning table; and
- a plurality of coupling means, each including two opposing arms having spherical contact ends, the first arm being affixed to said workpiece supporting superstructure to form a reference surface, and the second arm being resiliently mounted to form a clamp with said first arm, wherein said workpiece is retained therebetween.

23. The system of claim 22 wherein the center lines of said spherical contact ends are approximately coaxial and approximately parallel to the Z Cartesian axis.

24. The system of claim 22 having three of said coupling means.

25. The system of claim 24 wherein said second arm of one of said coupling means is replaced by a weaker restraining means sufficient to maintain contact between said workpiece and said reference surface on said first arm.

26. A workpiece positioning system for substantially avoiding mechanical hysteresis and providing accurate and precisely repeatable movement of a workpiece with respect to an associated apparatus which operates on the workpiece, comprising:
- a movable positioning table;
- a workpiece supporting superstructure;
- support means for joining said workpiece supporting superstructure to said movable positioning table;
- locating means for directing the movement of said movable positioning table; and
- a plurality of two-stage coupling means wherein a first removable stage includes two opposed arms having spherical contact ends, the first arm being fixed to form a reference surface and the second arm resiliently mounted to form a clamp with said first arm to thereby engage and retain said workpiece; and
- a tab element which is engaged and retained in a second stationary stage of said coupling means; and
- wherein said stationary stage includes two opposing arms having spherical contact ends, the first arm being affixed to said workpiece supporting superstructure to form a reference surface, and the second arm being resiliently mounted to form a clamp with said first arm to thereby engage and retain said tab element, whereby said removable stage can be removably received in said stationary stage.

27. The system of claim 26 wherein the center lines of said spherical contact ends of said removable stage are approximately coaxial and approximately parallel to the Z Cartesian axis and wherein the center lines of said stationary stage are approximately coaxial and approximately parallel to the Z Cartesian axis.

28. The system of claim 27 wherein there are three two-stage coupling means.

29. The system of claim 28 wherein said second arm of one of said coupling means is replaced by a weaker restraining means sufficient to maintain contact between said workpiece and said reference surface on said first arm.

30. A workpiece positioning system for substantially avoiding mechanical hysteresis and providing accurate and precisely repeatable movement of a workpiece with respect to an associated apparatus which operates on the workpiece, comprising:
- a movable positioning table;
- a workpiece supporting superstructure;
- a locating means for directing the movement of said movable positioning table;
- a plurality of two stage coupling means wherein a first removable stage includes two opposed arms having spherical contact ends, the first arm being fixed to form a reference surface and the second arm resiliently mounted to form a clamp with said first arm to thereby engage and retain said workpiece; and
- a tab element which is engaged and retained in a second stationary stage of said coupling means; and
- wherein said stationary stage includes two opposing arms having spherical contact ends, the first arm being affixed to said workpiece supporting superstructure to form a reference surface, and the second arm being resiliently mounted to form a clamp with said first arm to thereby engage and retain said tab element whereby said stage can be removably received in said stationary stage;
- three kinematic support means;
- said kinematic support means being elastically secured to both said movable positioning table and to said workpiece supporting superstructure;
- a first of said three support means being a column that is elastically joined to said movable positioning table and to said workpiece supporting superstructure, and which has a ratio of bending rigidity to effective spring rate for torsion of at least 150;
- a second of said three support means being a flat spring member providing a restraining force perpendicular to said reference axis that is at least 150 times greater than said spring member's restraining force parallel to said reference axis;
- the third of said three support means being a column that is elastically joined to said movable positioning table and to workpiece supporting superstructure;
- said column having a slenderness ratio of the rage of approximately 20-50.

31. The system of claim 30 wherein the center lines of said spherical contact ends of said removable stage are approximately coaxial, and approximately parallel to the Z Cartesian axis; and
- wherein the center lines of said spherical contact ends of said stationary stage are approximately coaxial and approximately parallel to the Z Cartesian axis.

32. The system of claim 31 wherein there are three two stage coupling means.

33. The system of claim 32 wherein said second arm of one of said coupling means is replaced by a weaker restraining means sufficient to maintain contact between said workpiece and said reference surface on said first arm.

34. The system of claim 33 wherein said locating means for directing the movable positioning table comprises a laser interferometer system.

35. The system of claim 34 wherein a reflecting means which interacts with the laser interferometer is an integral part of said workpiece supporting superstructure.

36. The system of claim 35 wherein said apparatus which operates on a workpiece is an electron beam column, and said workpiece is a photolithographic plate or a semiconductor wafer.

37. The system of claim 36 wherein said plurality of two stage coupling means and said workpiece supporting superstructure are made of non-ferromagnetic material which exhibit a residual magnetic field of less than 0.002 gauss after being exposed to a strong magnetic field.

* * * * *

UNITED STATES PATENT AND TRADEMARK OFFICE
CERTIFICATE OF CORRECTION

PATENT NO. : 4,642,438

DATED : February 10, 1987

INVENTOR(S) : Karl W. Beumer et al.

It is certified that error appears in the above-identified patent and that said Letters Patent is hereby corrected as shown below:

Column 10, line 59  "forces" should be --force--.

Column 13, line 32  "FIG. 1" should be --FIG. 1A--.

Column 16, line 51  After "selectively" insert --constrained--.

Column 15, line 53  "containing" should be --constraining--.

Signed and Sealed this

Twenty-second Day of September, 1987

Attest:

DONALD J. QUIGG

Attesting Officer     Commissioner of Patents and Trademarks